United States Patent
Daigle

(10) Patent No.: US 9,100,004 B2
(45) Date of Patent: *Aug. 4, 2015

(54) BUFFER SYSTEM HAVING REDUCED THRESHOLD CURRENT

(71) Applicant: Fairchild Semiconductor Corporation, San Jose, CA (US)

(72) Inventor: Tyler Daigle, Portland, ME (US)

(73) Assignee: Fairchild Semiconductor Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/072,442

(22) Filed: Nov. 5, 2013

(65) Prior Publication Data

US 2014/0055164 A1 Feb. 27, 2014

Related U.S. Application Data

(63) Continuation of application No. 13/069,624, filed on Mar. 23, 2011, now Pat. No. 8,575,963.

(51) Int. Cl.
*H03K 19/094* (2006.01)
*H03K 19/003* (2006.01)
*H03K 3/3565* (2006.01)
*H03K 5/00* (2006.01)

(52) U.S. Cl.
CPC ........ *H03K 19/00361* (2013.01); *H03K 3/3565* (2013.01); *H03K 2005/00052* (2013.01)

(58) Field of Classification Search
USPC .............................. 326/21–34, 80–83, 86–87
See application file for complete search history.

(56) References Cited

U.S. PATENT DOCUMENTS

| | | | |
|---|---|---|---|
| 5,304,867 A | | 4/1994 | Morris |
| 5,483,176 A | * | 1/1996 | Rodriguez et al. ............. 326/21 |
| 5,583,457 A | * | 12/1996 | Horiguchi et al. ............ 326/121 |
| 5,731,713 A | * | 3/1998 | Proebsting et al. ............ 326/71 |
| 5,808,496 A | | 9/1998 | Thiel |
| 6,118,318 A | | 9/2000 | Fifield et al. |
| 6,127,815 A | | 10/2000 | Wilcox |
| 6,320,418 B1 | * | 11/2001 | Fujii et al. ....................... 326/93 |
| 6,323,685 B1 | | 11/2001 | Vo |
| 6,366,066 B1 | | 4/2002 | Wilcox |
| 6,552,596 B2 | | 4/2003 | Cowles et al. |
| 6,566,910 B1 | | 5/2003 | Joo |
| 6,979,984 B2 | | 12/2005 | Perrier et al. |
| 7,215,103 B1 | | 5/2007 | Wong et al. |
| 7,236,019 B2 | | 6/2007 | Cowles et al. |
| 7,463,076 B2 | * | 12/2008 | Komura et al. ............... 327/291 |
| 7,696,790 B2 | | 4/2010 | Cowles et al. |
| 7,750,668 B2 | * | 7/2010 | Horiguchi et al. ............. 326/33 |
| 7,868,666 B2 | | 1/2011 | Huang et al. |
| 2008/0180154 A1 | | 7/2008 | Brannen |
| 2008/0238513 A1 | | 10/2008 | Poenaru et al. |
| 2010/0259298 A1 | | 10/2010 | Huang et al. |
| 2010/0320997 A1 | | 12/2010 | McQuirk et al. |
| 2010/0327930 A1 | | 12/2010 | Yan et al. |

* cited by examiner

*Primary Examiner* — Jany Richardson
(74) *Attorney, Agent, or Firm* — Grossman Tucker Perreault & Pfleger PLLC

(57) ABSTRACT

A buffer system is provided that reduces threshold current using a current source to provide power to one or more stages of the buffer system. The buffer system may also include delay management techniques that balances all of, or part of, a delay that may be imparted to an input signal by the current source. In addition, hysteresis techniques may be used to provide enhanced noise management of the input signal.

14 Claims, 3 Drawing Sheets

BUFFER SYSTEM HAVING REDUCED THRESHOLD CURRENT

CROSS REFERENCE TO RELATED APPLICATIONS

This application is a continuation of U.S. patent application Ser. No. 13/069,624 (now U.S. Pat. No. 8,575,963) filed Mar. 23, 2011, the entire disclosure of which is incorporated herein by reference.

FIELD

The present disclosure relates to a buffer system, and more particularly, to a buffer system having reduced threshold current.

BACKGROUND

Buffer circuits are widely used in many digital systems, and generally provide impedance matching and edge setting functions between an input signal and other circuitry, for example, other circuitry associated with an integrated circuit (IC). In digital mixed signal systems, the input buffer may include one or more switching stages that switch in response to an input signal. While the threshold current that is actually required to switch states in the buffer may be relatively low, impedances in the input buffer can cause a large, sustained current draw when communication between the IC and other circuitry occurs. For example, if the input buffer is powered by a voltage that is greater than the voltage of the input signal, the buffer circuit may draw a large threshold current when switching between states, as well as a continuous current draw while the input is asserted high. The presence of a large threshold current in the buffer can unnecessarily increase the overall power draw of the IC, which, in turn, may limit battery life and create thermal management issues. Conventional approaches for lowering the threshold current include current limiting the buffer, or part thereof, using large resistors and/or large area transistors. However, these approaches require an increase in IC die area to implement, and may adversely (and unpredictably) impact the bandwidth of the buffer and/or the circuitry of the IC.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Generally, this disclosure provides buffer systems (and methods) to buffer a digital input signal while reducing threshold current (Icct) that is drawn by the buffer during operation. Threshold current is generally defined as the current drawn by a switching device, or collection of switching devices, during the threshold of a transition from Low to High or from High to Low. Low power current source circuitry may be used to power selected stages of the buffer so that the maximum threshold current (Icct) of the buffer is, at a maximum, the value of the current source, thus providing a significant reduction in threshold current over the use of higher-power voltage rails. In addition, hysteresis circuitry may be used so that toggling between states in the buffer is less susceptible to noise. Advantageously, the buffer systems of the present disclosure provide reduced Icct without requiring large resistors and/or large transistors, thus increasing operational bandwidth and reducing overall die area.

Figure 1:
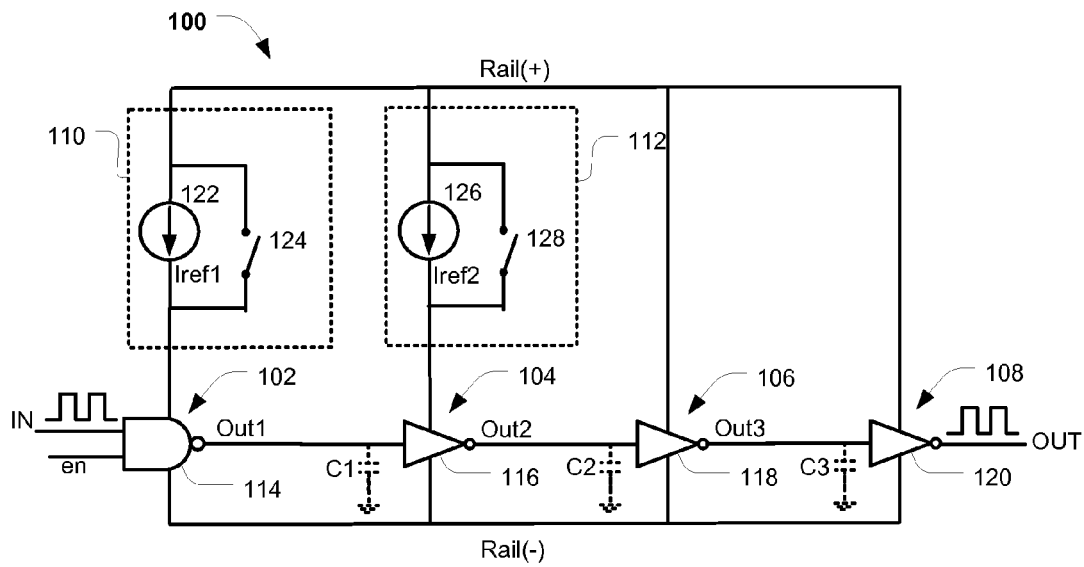
FIG. 1 illustrates an input buffer system consistent with various embodiments of the present disclosure.

FIG. 1 illustrates a buffer system 100 consistent with various embodiments of the present disclosure. The buffer system 100 of FIG. 1 includes a plurality of stages, generally designated as 102, 104, 106 and 108, to buffer an input signal (IN) and generate a buffered output signal (OUT). The buffer system 100 of FIG. 1 includes first current limiting circuitry 110 configured to supply power to the first stage 102, and may also include second current limiting circuitry 112 configured to supply power to the second stage 104. The buffer system 100 depicted in FIG. 1 may be included with, or form part of, a general-purpose or custom integrated circuit (IC) such as a semiconductor integrated circuit chip, system on chip (SoC), etc.

The first stage 102 may include NAND gate circuitry 114 configured to receive the input signal (IN) and, in some embodiments, an enable signal (en). The input signal (IN) may be a digital signal, such as a digital pulse train or digital serial data stream. In one embodiment, the enable signal (en) may be fixed at a high value (logic or digital "1") so that the NAND gate 114 operates as an inverter to IN. In other embodiments, the enable signal (en) may be derived from, or based on, for example, a power on reset signal that remains low while the power supply Rail(+) is ramping up, and, once Rail(+) crosses a selected threshold, the enable signal (en) may be fixed high at the high value. Once the enable signal (en) is high, NAND gate circuitry 114 may operate as an inverter to the input signal IN. In other embodiments, the first stage 102 may include inverter circuitry, similar to stages 104, 106 and/or 108, configured to receive the input signal IN.

The second 104, third 106 and fourth 108 stages of the buffer system 100 may include respective inverter circuitry 116, 118 and 120. Each stage 102, 104, 106 and 108 may be coupled in series to provide successive switching of digital states between High and Low (logic or digital "0"). Thus as IN swings High, the output of the first stage 102 is Low, the output of the second stage 104 is High, the output of the third stage 106 is Low and the output of the fourth stage 108 is High (and, of course, the reverse operations occur when IN swings Low). The inverter circuitry 116 may comprise one or more transistor devices (e.g., MOS and/or BJT devices) that may have associated inherent input capacitance, shown in broken lines as C1 tied to a ground (or reference) potential. Similarly, inverter circuitry 118 and 120 may have associated inherent input capacitance, shown in broken lines as C2 and C3, respectively. Power supply rails Rail (+) and Rail (−) may be used to supply power to selected stages and/or used as a reference potential for selected stages of the buffer system 100 (as will be described below). In some embodiments, the power supply, Rails (+)/(−), may be derived from an internal reference voltage associated with the IC (e.g., Vcc, Vdd, etc.). The first current limiting circuitry 110 may include current source circuitry 122 and enable/disable switch circuitry 124. The first current limiting circuitry 110 may be coupled between the rail voltage Rail (+) and the first stage 102. The current source circuitry 122 is configured to generate a reference current (Iref1) sufficient to provide power to the NAND gate 114. The value of Iref1 may be based on, for example, the lowest stable current source that can be produced in the IC, which typically is far less than the current (Icc) that is generally available current on Rail(+) (e.g., Iref1<<available Icc, which may be orders of magnitude different) Using the lowest stable current source for Iref1 may ensure minimal power consumption. However, as Iref1 decreases, there may be unpredictable effects in threshold voltage and propagation delay.

Generally, the smaller the current source Iref1, the greater the propagation delay from IN to Out1 (which may limit bandwidth). Thus, the value of Iref1 may also be based on stability and/or bandwidth considerations.

The current source circuitry 122, in general, operates to limit the threshold current (Icct) that may be drawn by the NAND gate circuitry 114. Thus, instead of drawing a relatively large threshold current from the voltage supply Rail (+)/(−), the current source circuitry 110 limits the amount of current that can be drawn by the NAND gate 114 to a maximum of Iref1. The enable/disable switch circuitry 124 may include any type of switch device (e.g., MOS transistor, BJT, etc.). The switch circuitry 124 may provide control over the power supply to the NAND gate 114. When the switch 124 is controlled to be open, the current source circuitry 122 provides power the NAND gate circuitry 114, and when controlled to be closed, the current source circuitry 122 is bypassed and the rail voltage Rail(+) may supply power to the NAND gate circuitry 114. In general, the amount of current supplied by current source 122 is substantially less than the amount of current available from the rail (Rail (+)). Thus, providing control over the selection of a power supply to the NAND gate circuitry 114 may be advantageous in some implementations. For example, when Iref1 is supplying power and thus limiting Icct that can be drawn by the NAND gate 114, this may cause slight decrease in overall switching speed of the NAND gate 114. If an increase in switching speed is desired, at the cost of an increase in Icct, the current source circuitry 122 may be bypassed.

Figure 2:
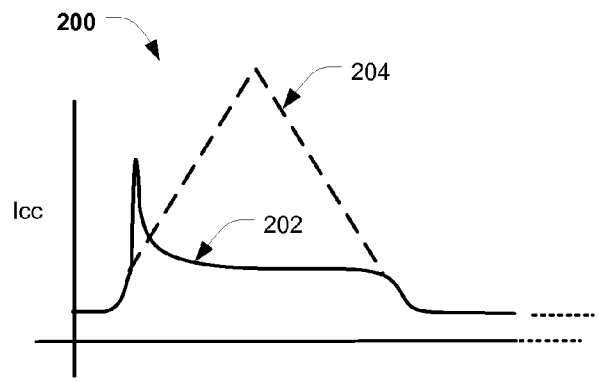
FIG. 2 illustrates a signal plot of the threshold current associated with an input buffer system consistent with one embodiment of the present disclosure.

One advantage of the features of the buffer system 100 is depicted in FIG. 2. With continued reference to FIG. 1, FIG. 2 illustrates a signal plot 200 if Icc verses time (t), and generally depicts the threshold current draw of the buffer system 100 during a switch transition from Low to High, or from High to Low. In operation, when the current source 122 is supplying power to the first stage 102, the threshold current is depicted by signal 202. At the beginning of a switch transition, the threshold current may charge capacitors C2 and C3, and this is depicted as the relative spike at the beginning of signal 202. The maximum amount of current that can be drawn from the first stage 102 is Iref1. The spike may include additional Iref2 at the beginning of a toggle of stages 104, 106 and 108. Thereafter, the value of Icct drops to a value that is based on Iref1. In contrast, if the current source 122 is bypassed (via, for example, switch 124) so that the first stage 102 is powered by the rail voltage Rail (+), a much larger Icct current is drawn by the first stage 102, as depicted by the signal 204 (shown in dashed lines). The signal plot 200 is not drawn to scale, and is provided to depict the relative differences between Icct. Thus, significant reduction in Icct may be realized using the buffer system 100.

When the current source circuitry 122 is providing power to the NAND gate 114, the output of the NAND gate 114, Out1, is inverted to the input signal IN (assuming the enable signal (en) is fixed High). Out1, in turn, is used as an input to the inverter 116, and to drive the impedance, C1, of the inverter 116. When the input signal (IN) transitions from Low to High, Out1 transitions from High to Low, and C1 discharges to ground. When the input signal (IN) transitions from High to Low, Out1 transitions from Low to High, and C1 charges. However, since current source circuitry 122 limits the current draw of the NAND gate 114 (as opposed to being coupled to the rail voltage Rail (+)), the charging time of C1 may be greater than the discharge time of C1, and thus a larger delay may occur when transitioning, through the NAND gate 114, from Low to High verses High to Low.

Figure 3:
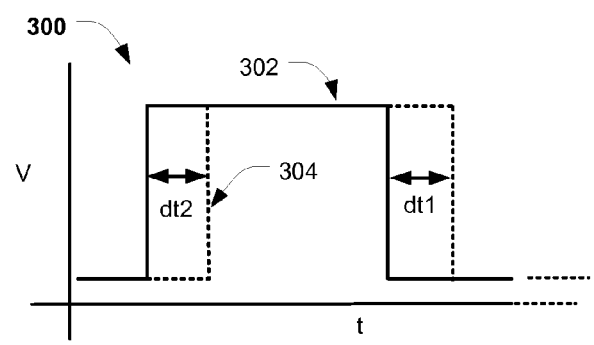
FIG. 3 illustrates a signal plot of delay times between input and output signals of an input buffer system consistent with one embodiment of the present disclosure.

Accordingly, the buffer system 100 of this embodiment may also include second current limiting circuitry 112 configured to supply power to, and to limit the threshold current of, the second stage 104. The second current limiting circuitry 112, similar to the first current limiting circuitry 110, may include a current source 126 configured to generate a second reference current Iref2, and may also include switch circuitry 128. The second current limiting circuitry 112 may be coupled between the rail voltage Rail (+) and the second stage 104. The operation of circuitry 112 is similar to the operation of 110, described above. As also described above, the charging of C1 may cause a delay in when the input signal transitions from High to Low (Out1 switching Low to High), which delay may be greater than when the input signal transitions from Low to High (Out1 switching High to Low). To prevent an imbalance of delay between transition states, the second current source 126 may impart a delay when the input signal transitions Low to High (Out2 switching Low to High). This concept is illustrated in FIG. 3. Referring briefly to FIG. 3, and with continued reference to FIG. 1, FIG. 3 illustrates a signal plot 300 of the input signal IN 302 and the output signal OUT 304. A delay, dt1, may be caused by limiting the threshold current of the first stage 102 when IN transitions from High to Low (Out1 transitions from Low to High and charging C1). A similar delay, dt2, may be caused by limiting the threshold current of the second stage 104 when IN transitions from Low to High (Out2 transitions from Low to High and charging C2). In one embodiment, the value of Iref1 is substantial equal to the value of Iref2. However, in other embodiments, due to, for example, component differences between the first 102 and second stage 104, the value of Iref2 may differ from Iref1, and Iref1 and/or Iref2 may be selected so that the delay of the second stage 104 is substantially equal to the delay of the first stage 102. In any embodiment, the terms "substantially equal" mean within a selected range (e.g., within 10%), and/or within the component tolerances of the devices utilized in the topology. In another embodiment, instead of coupling the second current limiting circuitry 112 between the rail voltage Rail (+) and the second stage 104, circuitry 112 may be coupled between the rail voltage Rail (−) and the first stage 102. In such an embodiment, the circuitry 112 may provide a limited current source when Out 1 is transitioning High to Low (i.e., when C1 is discharging) which, in turn, may create a delay similar to the delay when C1 is charging. However, in a standard inverter powered directly by Rail(+) and Rail(−), the threshold voltage is not perfectly set at Rail(+)/2 (it is rather somewhere between Rail(+) and Rail(−)). Therefore, a difference in propagation delay is introduced when toggling Low to High than from High to Low. Using the current source 122 may multiply the amount of propagation delay when toggling IN from High to Low. Similarly, adding current source 126 from 102 to Rail (−) may operate to multiply the propagation delay when toggling IN from Low to High. However, since the propagation delays (without current sources) may not be identical, the resulting propagation delays (assuming substantially identical current sources from Rail(+) to 102 and from 102 to Rail(−)) may not be identical. To account for this difference, the current sources 122 and 126 may be given different values to create substantially equal propagation delays. However, matching propagation delays by adjusting Iref1 and/or Iref2 may, in some implementations, be difficult and sometimes unreliable. Using two inverters with current sources connected from Rail(+) (such as 102 and 104 in FIG. 1) multiplies propagation delay when Out1 toggles Low to High and when Out2 toggles from Low to High, which may provide more even delay times.

In yet another embodiment circuits 110 and 112 may be coupled between 102 and Rail(−) and between 104 and Rail (−), respectively. Such an embodiment may obtain the same (or approximately the same) delay times as with circuitry 110 and 112 coupled as depicted in FIG. 1 and described above. Of course, in any of the embodiments described herein, if the delay (dt1) that may be caused by the first current source circuitry 110 is negligible or within operational parameters, the second current source circuitry 112 may be omitted and/or bypassed (via switch circuitry 128), and the second stage 104 may be powered directly from the voltage rails Rail (+)/(−).

The third stage 106 and the fourth the stage 108 may include inverter circuitry 118 and 120, respectively. Each of stages 106 and 108 may be powered by the rail voltage Rail (+)/(−).

The third stage 106 and/or the fourth stage 108 may be included to provide a "cleaner" edge to the output signal (i.e., decrease the skew which may be imparted to the input signal by the first 102 and/or second 104 stage). In addition, the third stage 106 and/or the fourth stage 108 may include "larger" transistor elements capable of providing greater drive for the input signal, if, for example, the output of the buffer system 100 is being used to drive many transistor gates, which would create large capacitive loads. Of course, in other embodiments, the third stage 106 and/or the fourth stage 108 may be omitted.

Figure 4:
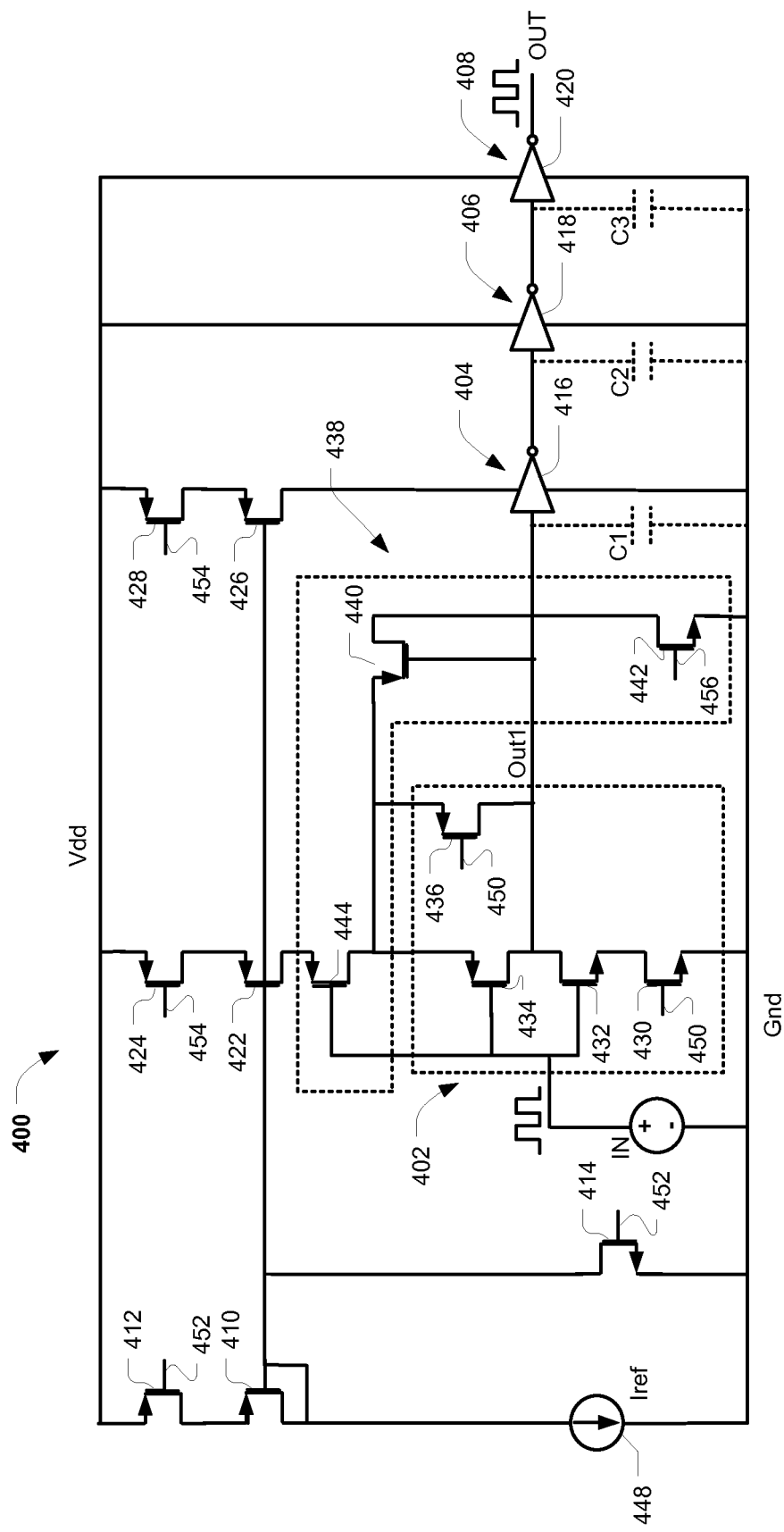
FIG. 4 illustrates another input buffer system consistent with various embodiments of the present disclosure.

FIG. 4 illustrates another input buffer system 400 consistent with various embodiments of the present disclosure. The foregoing description of FIG. 4 shall refer to an individual NMOS and PMOS element as a "switch", and thus, it should be understood that although FIG. 4 depicts NMOS and PMOS elements, the system of FIG. 4 may, in some embodiments, be realized using BJT elements and/or other switching circuits. Similar to the buffer system of FIG. 1, the buffer system 400 of FIG. 4 includes a plurality of stages generally designated as 402, 404, 406 and 408 to buffer an input signal (IN) and generate a buffered output signal (OUT). As with the previous embodiment, the input signal (IN) may be a digital signal, such as a digital pulse train or digital serial data stream. The buffer system 400 of FIG. 4 may include first and second current limiting circuitry that include reference current source 448 and current mirror circuitry that includes switch 410, and switches 422 and 426. Current source 448 is configured to supply a reference current, Iref, which is mirrored through switch 410 to switches 422 and 426, and switches 422 and 426 supply power to stages 102 and 104, respectively.

The first stage 402 may include NAND gate circuitry comprising switches 430, 432, 434 and 436. Switches 432 and 434 are controlled by the input signal (IN). Switches 430 and 436 may be controlled by a fixed reference signal 450, for example an enable signal fixed at a high value (logic or digital "1") so that switches 432 and 434 operate as an inverter to IN. As previously described, the enable signal may be derived from, or based on, for example, a power on reset signal that remains low while the power supply Vdd is ramping up, and, once Vdd crosses a selected threshold, the enable signal may be fixed high at the high value. The first current source 422 is configured to supply power to the first stage 402 and is coupled between the power supply rail Vdd and the first stage 402 to limit the threshold current (Icct) that may be drawn by the first stage 402 during switching transitions.

The second 404, third 406 and fourth 408 stages of the buffer system 400 may include respective inverter circuitry 416, 418 and 420. Each stage 402, 404, 406 and 408 may be coupled in series to provide successive switching of digital states between High and Low (logic or digital "0"). Thus as IN swings High, the output of the first stage 402 is Low, the output of the second stage 404 is High, the output of the third stage 406 is Low and the output of the fourth stage 408 is High (and, of course, the reverse operation occurs when IN swings Low). The inverter circuitry 416 may comprise one or more transistor devices (e.g., MOS and/or BJT devices) that may have associated inherent input impedance, shown in broken lines as C1 tied to a ground (Gnd, or reference) potential. Similarly, inverter circuitry 418 and 420 may have associated inherent input impedance, shown in broken lines as C2 and C3, respectively. Power supply rails, Vdd and Gnd, may be used to supply power to selected stages and/or used as a reference potential for selected stages of the buffer system 400 (as will be described below). In some embodiments, the power supply, Vdd and Gnd, may be derived from an internal reference voltage associated with an IC. To limit the threshold current (Icct) of the first stage 402 and second stage 404, the value of Iref may be selected to be substantially less than the available current on Vdd, and may also be selected based on bandwidth and/or current stability considerations described above.

Bypass circuitry may be included to bypass the reference current Iref generated by the current source 448. For example, switches 412 and 414 may be included to control which power supply, either Vdd or Iref, is used to power the first and second stages 402 and 404. For example, control signal 452 may control the switch states of switches 412 and 414. Control signal 452 may be asserted low so that switch 414 remains open (non-conducting) and switch 412 remains closed (conducting), to supply power to the first stage 402 and the second stage 404 from the current source 448 (Iref). If switch 414 is closed (conducting), switches 422 and 426 (and Iref) may be shunted to ground while Vdd supplies power to the first stage 402 and the second stage 404. In this case, switch 412 will open (non-conducting) so that there is not a direct short from Vdd to GND through 414. Switches 424 and 428 may remain closed during operation of the buffer system 400 by asserting control signal 454 Low. Switches 424 and 428 may be used to mirror the on resistance (resistance when closed) of switch 412. In some embodiments, switch 424 and/or 428 may be replaced with a direct short if it is not important that the currents supplied to 402 and 404 substantially equal (or substantially equal to a multiple of Iref).

The threshold current limiting abilities of using the current source 448 (via switch 422) to supply power to the first stage 402 is similar to the description provided above with reference to FIG. 1, and as depicted in FIG. 2. In addition, using the current source 448 (via switch 426) to impart a switching delay in the second stage 404 is similar to the description provided above with reference to FIG. 1, and as depicted in FIG. 3.

This embodiment may also include hysteresis circuitry 438. Hysteresis circuitry 438 generally operates to control a switch transition threshold of the first stage 402, so that the Low to High transition threshold is greater than a High to Low transition threshold. Thus, for example, so that the Low to High and High to Low switch transitions of the first stage 402 do not occur at approximately the same voltage, hysteresis circuitry 438 may control the first stage 402 so that the Low to High transition threshold voltage (input of stage 402) is greater than the High to Low transition threshold voltage (input of stage 402). Hysteresis circuitry 438 may include a hysteresis switch 440 and an enable/disable switch 442. The switch 442 may be controlled, via control signal 456, to enable or disable hysteresis, and generally, if switch 442 is closed (conducting), hysteresis switch 440 is configured to provide hysteresis for the switching states of the first stage 402. In operation, and assuming that the hysteresis circuitry 438 is enabled, when IN is High and Out1 is Low, switch 440 is closed (conducting). As a result, the source of switch 434 is tied to Gnd through on resistance of switches 440 and 442. As the input signal (IN) falls from High to Low, switch 434 does not switch states (open to closed) until the input signal (IN) drops below what was needed prior to the source of switch 434 being tied to Gnd (i.e., the gate of switch 434 needs to drop lower in order to switch states). However, switches 440 and 442 may operate to keep a threshold current flowing through the first stage 402, even after Out1 toggles High to Low. Accordingly, hysteresis circuitry 238 may also include switch 444 which operates to decouple switches 434 when IN toggles High. Thus, switch 444, in effect, discontinues Icct when IN toggles High. Hysteresis circuitry 438 may operate to increase noise tolerance which may be present on the input signal, however, the additional switch elements of the hysteresis circuitry 438 may create additional capacitance (e.g., increasing C1) which may create additional propagation delay, and may also limit bandwidth. Such an added propagation delay may be unbalanced between Low to High and High to Low transitions, and thus, current source 426 may be unmatched to added delay. If such an added delay is within operational parameters, hysteresis circuitry 438 may be enabled via switch 442. Otherwise, hysteresis circuitry 438 may be omitted or disabled.

As with the embodiment of FIG. 1, the buffer system 400 depicted in FIG. 4 may be included with, or form part of, a general-purpose or custom integrated circuit (IC) such as a semiconductor integrated circuit chip, system on chip (SoC), etc. Also, as with the previous embodiment of FIG. 1, the third stage 406 and/or the fourth the stage 408 may provide a "cleaner" edge to the output signal (i.e., decrease the skew which may be imparted to the input signal by the first 402 and/or second 404 stage) and/or be used to drive large capacitive loads. Of course, the third stage 406 and/or the fourth stage 408 may be omitted.

Figure 5:
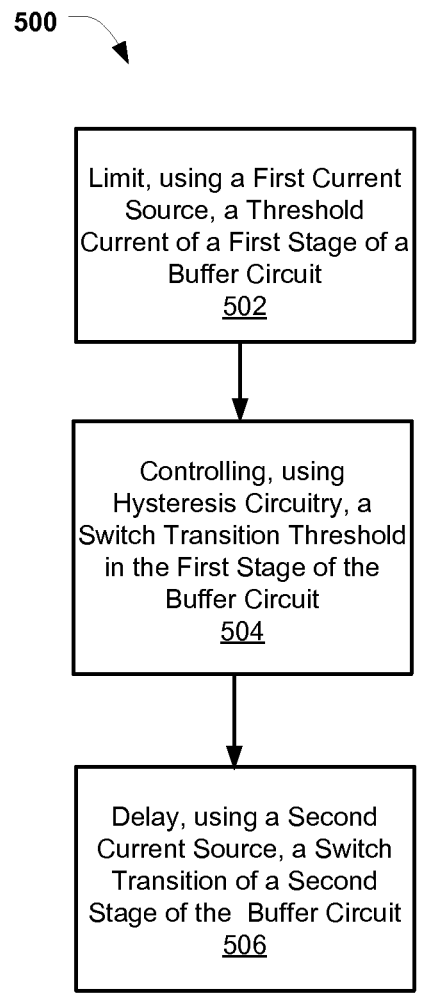
FIG. 5 illustrates a flowchart of operations according to one embodiment of the present disclosure.

FIG. 5 illustrates a flowchart 500 of operations according to one embodiment. Operations of this embodiment may include limiting, using a first current source, a threshold current of a first stage of a buffer circuit. Operations may also include controlling, using hysteresis circuitry, a switch transition threshold in the first stage of the buffer circuit 504, so that the Low to High transition threshold is greater than a High to Low transition threshold. Operations may further include delaying, using a second current source, a switch transition of a second stage of the buffer circuit 506.

While FIG. 5 illustrates various operations according to one embodiment, it is to be understood that in not all of these operations are necessary. Indeed, it is fully contemplated herein that in other embodiments of the present disclosure, the operations depicted in FIG. 5 may be combined in a manner not specifically shown in any of the drawings, but still fully consistent with the present disclosure. Thus, claims directed to features and/or operations that are not exactly shown in one drawing are deemed within the scope and content of the present disclosure. In addition, "circuitry" or "circuit", as used in any embodiment herein, may comprise, for example, singly or in any combination, hardwired circuitry, programmable circuitry, state machine circuitry, and/or circuitry available in a larger system, for example, discrete elements that may be included as part of an integrated circuit.

Thus, in one embodiment the present disclosure provides an input buffer system that includes first inverter stage circuitry configured to invert an input digital signal that switches between states. The input buffer system of this embodiment may also include first current source circuitry comprising a first current source coupled between a voltage rail and the first inverter stage circuitry. The first current source is configured generate a first reference current to supply power to the first inverter stage circuitry, and the first current source circuitry is further configured to limit a threshold current of the first inverter stage circuitry based on the first reference current.

In another embodiment, the present disclosure provides a method for reducing threshold current in a buffer system. The method includes limiting, using a first current source, the threshold current of a first stage of the buffer system; and delaying, using a second current source, a switch transition of a second stage of the buffer system.

In yet another embodiment, the present disclosure provides a buffer system that includes first inverter stage circuitry configured to invert an input digital signal that switches between states. The buffer system may also include first current source circuitry comprising a first current source coupled between a voltage rail and the first inverter stage circuitry. The first current source is configured generate a first reference current to supply power to the first inverter stage circuitry, and the first current source circuitry is further configured to limit a threshold current of the first inverter stage circuitry based on the first reference current. The buffer system may also include hysteresis circuitry, coupled to the first inverter stage circuitry, configured to control a switch transition threshold in the first inverter stage, so that the Low to High transition threshold is greater than a High to Low transition threshold.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An input buffer system, comprising:
   first inverter stage circuitry configured to switch at a first switching speed based on a first reference current and a second switching speed based on a second reference current; wherein the second reference current is greater than the first reference current and wherein the second switching speed is greater than the first switching speed;
second inverter stage circuitry configured to invert an output of the first inverter stage circuitry, the second inverter stage circuitry configured to switch at a third switching speed based on a third reference current and a fourth switching speed based on a fourth reference current; wherein the fourth reference current is greater than the third reference current and wherein the fourth switching speed is greater than the third switching speed; and
hysteresis circuitry, coupled to the first inverter stage circuitry, configured to control a switch transition threshold of the input digital signal by the first inverter stage circuitry so that the Low to High switch transition threshold is greater than a High to Low switch transition threshold.

2. The input buffer system of claim 1, wherein:
the first reference current is configured to impart a delay on an input digital signal being switched by the first inverter stage circuitry, and
a delay imparted by the third reference current is substantially equal to the delay imparted by the first reference current.

3. The input buffer system of claim 1, further comprising:
third and fourth inverter stage circuitry coupled together in series with the first and second inverter stage circuitries, the third inverter stage circuitry is configured to invert an output of the second inverter stage circuitry and the fourth inverter stage circuitry is configured to invert an output of the third inverter stage circuitry.

4. A method comprising:
inverting an input digital signal to an intermediate signal at a first switching speed based on a first reference current and a second switching speed based on a second reference current, the second reference current greater than the first reference current and the second switching speed greater than the first switching speed;
inverting the intermediate signal to an output signal at a third switching speed based on a third reference current and a fourth switching speed based on a fourth reference current, the fourth reference current greater than the third reference current and the fourth switching speed greater than the third switching speed; and
controlling a switch transition threshold of the input digital signal so that the Low to High switch transition threshold is greater than a High to Low switch transition threshold of the input digital signal.

5. The method of claim 4, wherein:
the first reference current is configured to impart a delay on the input digital signal being inverted, and
a delay imparted by the second reference current is substantially equal to the delay imparted by the first reference current.

6. An input buffer system, comprising:
a reference transistor having a drain and a gate coupled to a reference current source;
a first transistor coupled to first inverter stage circuitry, a gate of the first transistor coupled to the gate of the reference transistor;
a second transistor coupled to second inverter stage circuitry, the second inverter stage circuitry configured to invert an output of the first inverter stage circuitry, a gate of the second transistor coupled to the gate of the reference transistor; and
a bypass transistor having a drain connected to the gate of the reference transistor and a source connected to ground,
wherein the input buffer system is configured to control the first transistor and the second transistor based on the reference current source if the bypass transistor is not conducting and configured to control the first transistor and the second transistor to conduct if the bypass transistor is conducting.

7. The input buffer system of claim 6, further comprising:
a short circuit prevention transistor coupled between the reference transistor and a voltage rail, the short circuit prevention transistor configured to not conduct if the bypass transistor is conducting.

8. The input buffer system of claim 7, further comprising:
a first select transistor coupled in series with the first transistor between the voltage rail and the first inverter stage circuitry; and
a second select transistor coupled in series with the second transistor between the voltage rail and the second inverter stage circuitry, wherein
the first select transistor and the second select transistor mirror an on-resistance of the short circuit prevention transistor.

9. The input buffer system of claim 6, further comprising:
third inverter stage circuitry coupled in series with the second inverter stage circuitry, the third inverter stage circuitry configured to invert an output of the second inverter stage circuitry; and
fourth inverter stage circuitry coupled in series with the third inverter stage circuitry, the fourth inverter stage circuitry configured to invert an output of the third inverter stage circuitry.

10. The input buffer system of claim 6, wherein the first inverter stage circuitry further comprises a NAND gate configuration.

11. The input buffer system of claim 6, wherein the first inverter stage circuitry further comprises:
a first enable transistor configured to conduct if the voltage rail is below a threshold voltage; and
a second enable transistor configured to conduct if the voltage rail is above the threshold voltage.

12. The input buffer system of claim 11, wherein the first inverter stage circuitry further comprises:
a high transistor in parallel with the first enable transistor, the high transistor having a source coupled to a source of the first enable transistor, a drain coupled to a drain of the first enable transistor, and a gate coupled to the input digital signal; and
a low transistor in series with the second enable transistor, the low transistor having a drain coupled to the drain of the high transistor, a source coupled to a drain of the second enable transistor, and a gate coupled to the input digital signal, wherein
the output of the first inverter stage circuitry is between the drain of the high transistor and the drain of the low transistor.

13. The input buffer system of claim 12, further comprising:
a hysteresis enable transistor coupled between the output of the first inverter stage circuitry and ground, the hysteresis enable transistor configured to conduct if a hysteresis enable signal is high;
a first hysteresis transistor in series with the high transistor, the first hysteresis transistor having a source coupled to the voltage rail, a drain coupled to the source of the high transistor, and a gate coupled to the input digital signal; and
a second hysteresis transistor coupled between the hysteresis enable transistor and the first hysteresis transistor, the second hysteresis transistor having a source coupled to the drain of the first hysteresis transistor, a drain coupled to the output of the first inverter stage circuitry and a drain of the hysteresis enable transistor, and a gate coupled to the output of the first inverter stage circuitry.

14. The input buffer system of claim 6, further comprising: hysteresis circuitry, coupled to the first inverter stage circuitry, configured to control a switch transition threshold of the input digital signal by the first inverter stage circuitry so that the Low to High switch transition threshold is greater than a High to Low switch transition threshold.

* * * * *